United States Patent
Long (10) Patent No.: US 7,357,673 B2
(45) Date of Patent: Apr. 15, 2008

(54) SHIELDED CAGE ASSEMBLY FOR ELECTRICAL CONNECTORS

(75) Inventor: Jerry A. Long, Elgin, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 11/170,047

(22) Filed: Jun. 29, 2005

(65) Prior Publication Data

US 2006/0003632 A1    Jan. 5, 2006

Related U.S. Application Data (60) Provisional application No. 60/584,420, filed on Jun. 30, 2004, provisional application No. 60/639,496, filed on Dec. 23, 2004.

(51) Int. Cl.
*H01R 13/648* (2006.01)

(52) U.S. Cl. .................................. 439/608

(58) Field of Classification Search ........ 439/607–610, 439/108, 701, 594, 680–681, 358, 78, 733.1
See application file for complete search history.

(56) References Cited

U.S. PATENT DOCUMENTS

| | | | |
|---|---|---|---|
| 3,587,028 A * | 6/1971 | Uberbacher | 439/49 |
| 4,611,867 A * | 9/1986 | Ichimura et al. | 439/101 |
| 5,394,305 A | 2/1995 | Moral et al. | |
| 5,429,528 A * | 7/1995 | Longueville et al. | 439/608 |
| 6,276,963 B1 | 8/2001 | Avery et al. | |
| 6,503,108 B1 * | 1/2003 | Kikuchi et al. | 439/680 |
| 6,724,641 B1 | 4/2004 | Hwang | |
| 6,729,905 B1 | 5/2004 | Hwang | |
| 6,731,519 B1 | 5/2004 | Hwang | |
| 6,764,342 B2 * | 7/2004 | Murayama et al. | 439/608 |
| 7,070,446 B2 | 7/2006 | Henry et al. | |
| 2005/0254257 A1 | 11/2005 | Long | |
| 2005/0254772 A1 | 11/2005 | Long et al. | |
| 2005/0255726 A1 | 11/2005 | Long | |
| 2006/0003628 A1 | 1/2006 | Long et al. | |

\* cited by examiner

*Primary Examiner*—Edwin A. Leon
(74) *Attorney, Agent, or Firm*—Thomas D. Paulius (57) ABSTRACT

An integrated wall stacked shielded cage assembly is provided for electrical connectors. The cage assembly has multiple bays for receiving electrical components. At least two arrays of bays are provided, and the arrays are separated by an intervening space. Assembly is carried out with a plurality of spacers which interlock with a plurality of intermediate walls, and cover structures are provided in order to complete EMI shielding.

13 Claims, 10 Drawing Sheets

SHIELDED CAGE ASSEMBLY FOR ELECTRICAL CONNECTORS

REFERENCE TO RELATED APPLICATIONS

This application claims priority of prior U.S. provisional patent applications No. 60/584,420, filed Jun. 30, 2004 and No. 60/639,496, filed Dec. 23, 2004.

BACKGROUND OF THE INVENTION

This invention generally relates to electrical connectors, more particularly to small sized electrical connectors having a stacked arrangement. The illustrated connectors provide an adapter cage assembly for mounting multiple connectors in a stacked array of connector sets with one connector set mounted above another connector set. The invention includes multiple components which interlock together into a cage assembly for holding multiple modular transducers in place.

Electrical connectors are used in a wide variety of applications ranging from simple connecting interfaces between hard conductor wiring to more sophisticated applications involving such components as printed circuit boards, flat flexible cables and optical fibers. Basically, electrical connectors include some form of contacts, terminals or other conductors which interconnect one electrical device to another electrical device. The electrical connectors may involve systems whereby the connectors provide receiver-transmitter functions which, in addition, can convert high speed signals from solid (copper) cables or fiber optic cables to high speed signals on a system printed circuit board. As used herein, the terms "electrical" or "electrical connectors" or "electrical cable" are intended to include optical devices.

For instance, in the telecommunications industry, switching systems or circuitry may be provided on a rather sizable mother board at a particular location. A plurality of high speed electrical converter modules are mounted by appropriate frame structures on the mother board. Mating "plug-in" connector modules are plugged into the converter modules from outside the switching system. The incoming signals from the cables attached to the plug-in modules are at high speed, such as in the gigabit range, and the converter modules transfer and maintain the signals at high speed and transmit them to the circuitry on the mother board.

Electrical connectors which are adapted for mounting to printed circuit boards are known in the art and are commonly used for connection between two electrical communication devices. In order to ensure that a proper connection has been made to thereby create a link between the electrical communication devices, indicators may be incorporated into circuits on the printed circuit board. These indicators are typically light emitting diodes (LEDs) which are turned on when a circuit is completed between the mating connectors and the communication devices. Additionally, LEDs can be mounted on the printed circuit board to indicate a number of other conditions including the passage of communications signals between the two communication devices, indication of power, or indication that an error in transmitting the signals has occurred. So called light pipes can be provided in connection with these types of indicator functions or for other purposes.

Small size connectors must usually be within an exterior shielding cage in order to provide protection from electromagnetic interference, or EMI. Having such cages readily accommodate the connector array needed for a particular application, while providing excellent EMT protection, are objectives not easily achieved, especially given the smaller desired sizes of cages for applications.

Problems have been encountered in the design and manufacturability of such systems. One of the problems involves providing a system wherein the connector modules can be mounted above the mother board in arrays and spacings than can vary with the application, such as for specific routers or servers or other equipment. Heretofore, different frame structures often had to be provided to afford different stacked arrays and/or spacings. The present invention is directed to solving these problems by simple modifications which allow for the use of the same frame structure components for differently configured connectors.

SUMMARY OF THE INVENTION

Accordingly, it is a general aspect or object of the present invention to provide a shielding cage assembly that may be used with connectors that are stacked upon each other or which have engagement faces spaced vertically apart.

Another aspect or object of the present invention is to provide a cage assembly that may be utilized with a dual engagement connector component having two engagement areas vertically spaced apart from each other and which are each surrounded by a metal shield component, the cage and shield component defining multiple distinct module-receiving bays which can be separated by an intervening space.

A further aspect or object of the present invention is to provide an improved cage assembly of the type described above wherein the assembly includes multiple frame components that are assembled into the cage assembly so as to provide multiple bays on different levels for receiving modules for connection to a mother board or other component.

Yet a still further aspect or object of the present invention is to provide a cage assembly for the connection function and for EMI shielding in connection with electronic devices and which functions as a 2×4 SFP shielded cage assembly, while having the capability of being constructed into other arrays with one on top of another.

Still yet a further aspect or object of the present invention is to provide an electrical connector cage having two arrays of multiple bays that are assembled in stacked fashion from a plurality of spacers and walls having interlocking members.

Yet another aspect or object of the present invention is to provide a connector cage for use with a shielded assembly having a plurality of bays on multiple levels, the cage being an assembly of spacers having multiple legs and which may be U-shaped and of intermediate walls, this assembly being into structures for accommodating multiple connection pathways at different levels.

Still a further aspect or object of the present invention is to provide a shielded cage assembly for SFP style connectors for holding several modular transceivers and that provides improved EMI capability.

Yet still a further object of the present is to provide a shielding cage assembly for use with small form, pluggable connectors in which the shield cage assembly includes a cover and base plate that cooperatively define a hollow interior of the assembly, a plurality of wall members that, when inserted into the interior space, define a plurality of elongated module-receiving bays therein, the wall members including at least one horizontal and at least one vertical walls that mechanically and electrically interengage each other at a plurality of locations, the bays being open at the rear of the cage assembly as to permit the insertion of connectors thereinto, and the assembly further including a rear wall that is applied to the cover and base The present invention accomplishes these and other aspects or objects by way of its structure. In one principal aspect of the present invention and as exemplified by a preferred embodiment of the invention set forth herein, the cage assembly is provided for receiving a plurality of connectors in stacked arrays with one connector mounted above another connector. Multiple frame structures include at least a U-shaped spacer structure and intermediate wall structures which are assembled at interlock sites to form a structure including multiple receptacles for receiving respective sites to accommodate stacked connectors. The cage has a cover with integrated top and sidewalls and the spacers.

As disclosed herein, the spacer members and the frame structures are in an integral cage assembly and do not require separate and unique spacers apart from the cage construction itself. The spacer structure preferably takes the form of a U-shaped member that defines a pair of horizontal walls of the assembled cage assembly that are spaced apart from each other vertically. One or more vertical wall members are engaged with the spacer structure to define a plurality of "2-bays", that is a pair of module-receiving bays within the cage assembly, with the two bays of each pair being separated from each other by an intervening space that is defined by the spacer structure. This center intervening space may accommodate peripheral components such as indicator light pipes and the like.

Another feature of the invention is the provision of stamped and formed sheet metal components without requiring plastic components so as to provide good structural integrity and EMI shielding.

Other aspects, objects and advantages of the present invention will be understood from the following description according to the preferred embodiments of the present invention, specifically including stated and unstated combinations of the various features which are described herein, relevant information concerning which is shown in the accompanying drawing.

BRIEF DESCRIPTION OF THE DRAWINGS

The invention will now be described by way of example with reference to the following figures of which.

DETAILED DESCRIPTION OF THE PREFERRED EMBODIMENT

As required, detailed embodiments of the present invention are disclosed herein; however, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner.

Figure 1:
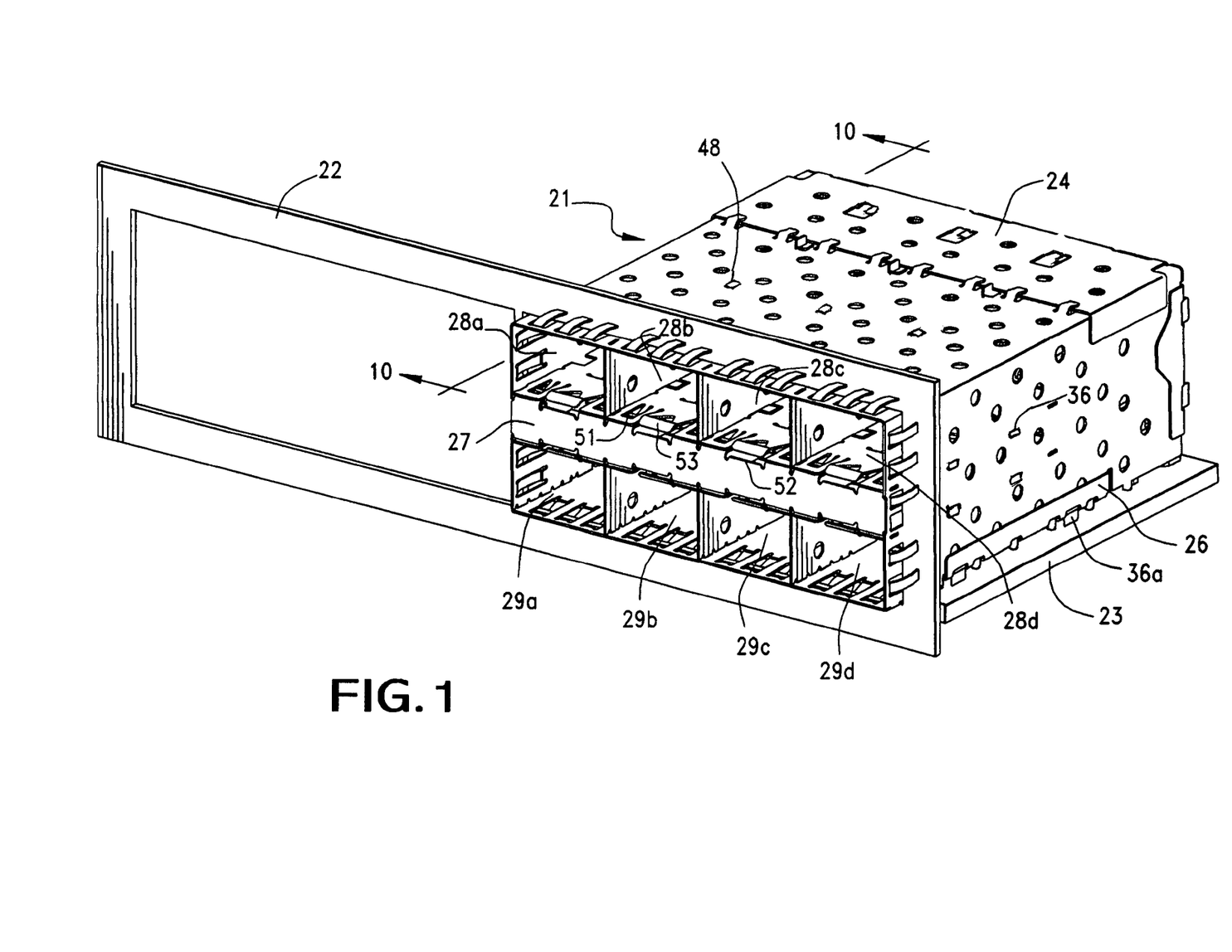
FIG. 1 is a perspective view of a combination of a shielding cage assembly constructed in accordance with the principles of the present invention illustrated in engagement with the face plate of an electronic device and an interior circuit board.
Figure 2:
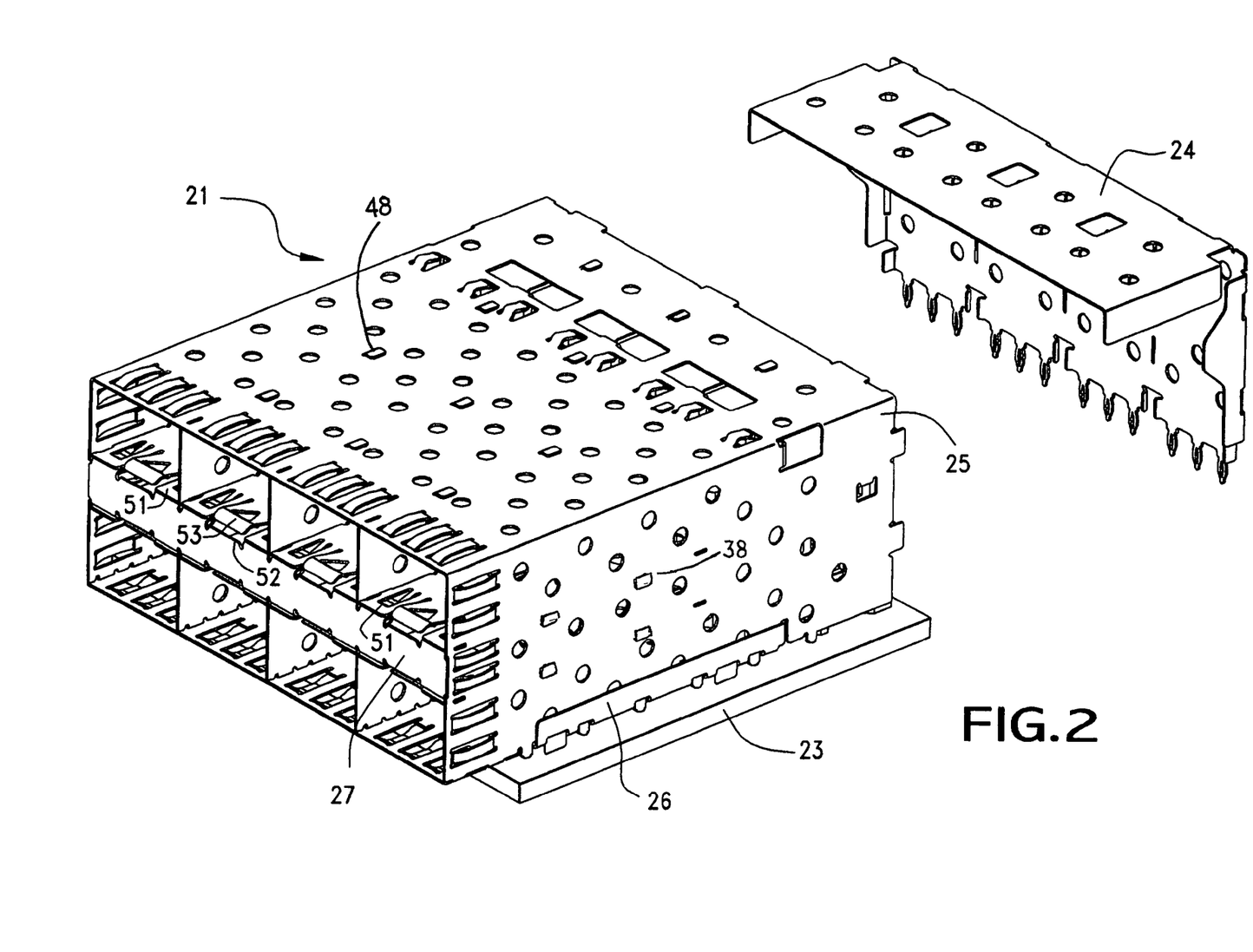
FIG. 2 is a partially exploded perspective view of the shielding cage assembly of FIG. 1 with the faceplate removed for clarity and the rear wall of the shield cage assembly shown removed therefrom.

Referring to the drawings in greater detail, and first to FIG. 1 and FIG. 2, a preferred cage assembly constructed in accordance with the principles of the present invention is illustrated generally at 21, and is illustrated in combination with the face plate 22 of an electronic device having circuit board and connector components, such as server, router or the like. A typical circuit board 23 also is illustrated which supports both electrical components and the cage assembly 21. The cage assembly in its preferred form is made of stamped and formed sheet metal components. The cage assembly shown in FIG. 1 is that of a 2×4 stacked cage arrangement having two rows or arrays of four bays each, one on top of the other with spacing there-between. It may also be considered as having four sets of two module-receiving bays that are stacked upon each other. A rear wall component 24 is shown separated from the rest of the cage assembly as illustrated in FIG. 2 and serves to close off the rear of the cage assembly and any connector components inserted thereinto.

Figure 3:
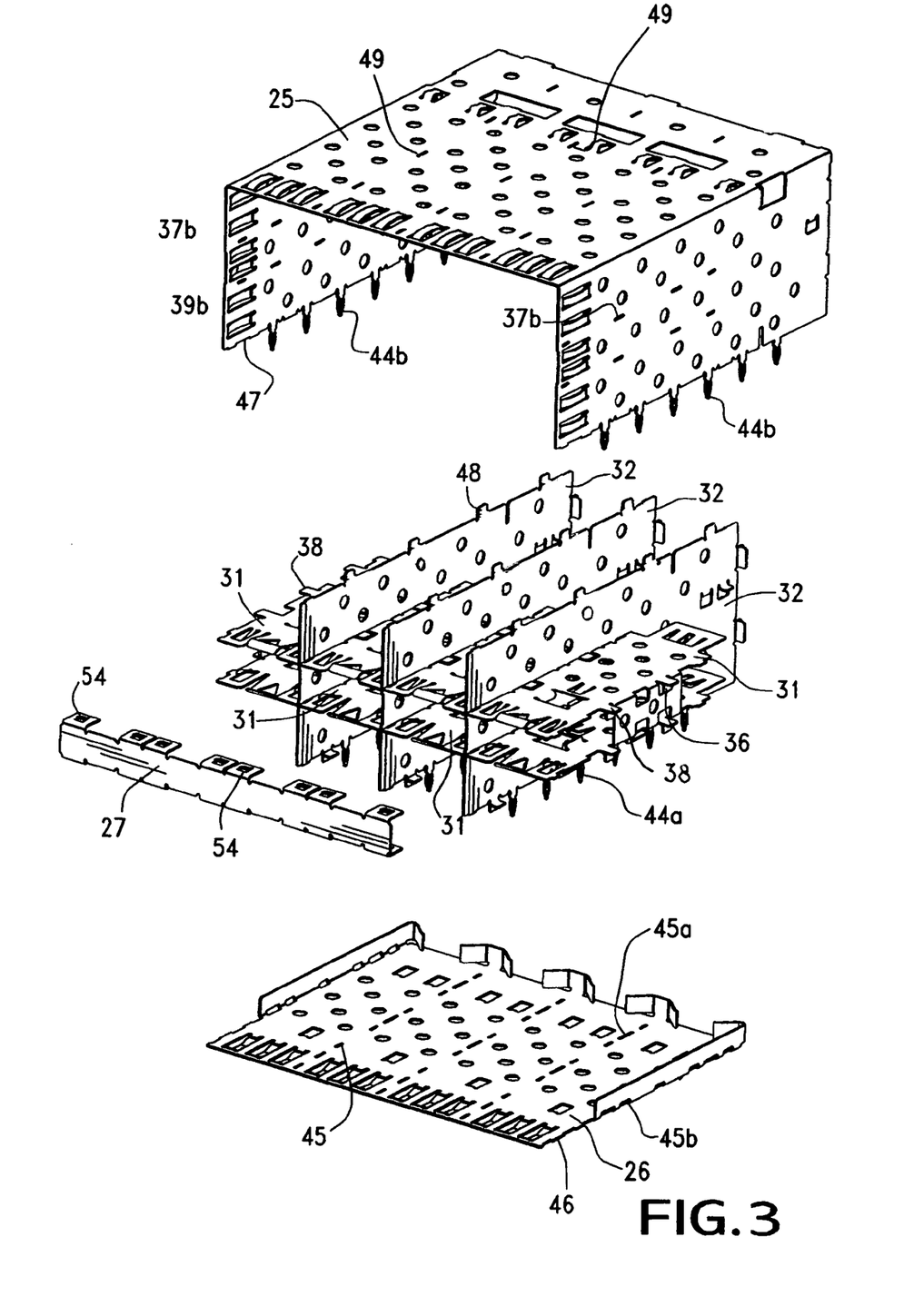
FIG. 3 is a further partially exploded perspective view of the shielding cage assembly of FIG. 1.

FIG. 3 illustrates further components of the cage assembly absent the rear wall 24. These include a cover component 25 which, in the illustrated embodiment, provides a top wall and two sidewall portions to the cage assembly. A bottom wall 26 also is shown, such typically resting on the circuit board 23 in the type of embodiment illustrated. A front end cap 27 is shown exploded from its location between the two loads or arrays of bays 28a, 28b, 28c and 28b in the top row, and 29a, 29b, 29c and 29d in the bottom row. (FIG. 1.)

The interior walls of the cage assembly include a pair of spacer elements 31 which are horizontal components (when viewed as in the drawings), each being of a generally U-shaped in this illustrated embodiment so that it defines, when assembled into the cage assembly, a pair of horizontal walls that are spaced apart from each other in the vertical direction. Interior walls 32 which are vertical components (as viewed in the drawings) provide upstanding interior walls of the cage assembly 21 engage the illustrated U-shaped members. The vertical interior walls 32 will now be discussed with reference to FIG. 4 and FIG. 5. Each spacer element 31 has spaced-apart horizontal panels or legs 33, 34 and at least one vertical spacer edge or base 35. One or more tabs 36 formed thereon project laterally beyond each spacer edge 35. Such lateral tabs 36 register with respective upper slots 37*a* in each interior wall 32 or with slots 37*b* that are formed in the cover component 25.

Interior wall engagement tabs 38 are sized and spaced to enter into and through respective upper slots 37*a* or lower slots 39*a* of the interior walls 32 or lower slots 39*b* of cover component 25. It will be appreciated that, once such tabs have entered into and through their respective slots, the entire assembly will be held together by the combination of tab in slot action, together with the rigidity of the cover component 25. Typically, tabs 38 which project through the top or sidewall portions of the cage assembly cover member 25 may be peened down or otherwise deformed in order to more permanently assemble the unit, such as at 36*a*. It will be noted that the horizontal wall members 33, 34 also include openings in the form of slots or recesses 41 (FIG. 4) that are disposed proximate to an engagement tab 38 and these openings 41 accommodate various tabs, particularly the lateral tabs 36, of an adjacent spacer structure, as illustrated best in FIG. 4.

Figures 4, 4A:
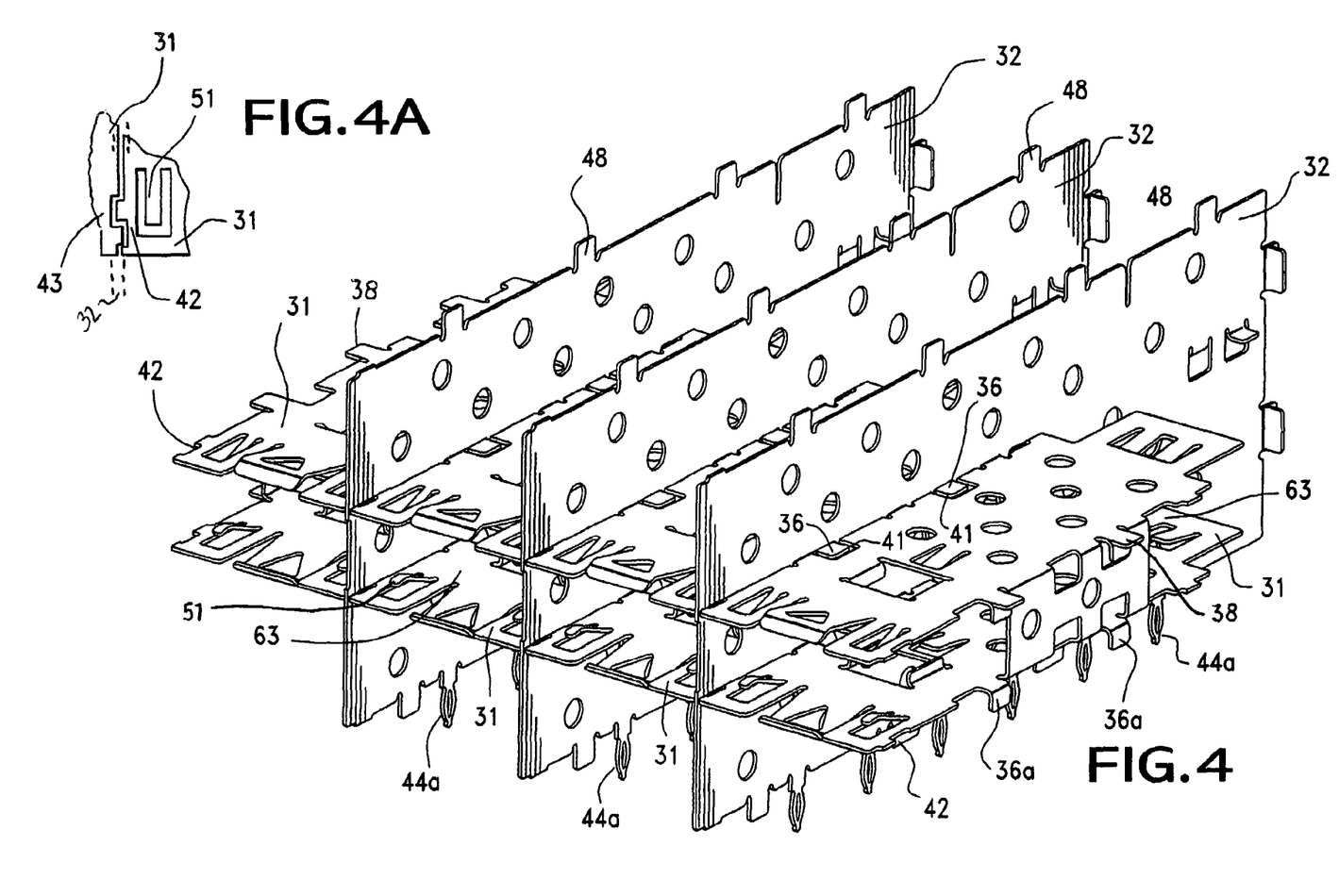
FIG. 4 is an enlarged perspective view of the interior portion of FIG. 3.
FIG. 4A is a detail view showing interlocking between the interior portion and the cover member.
Figure 5:
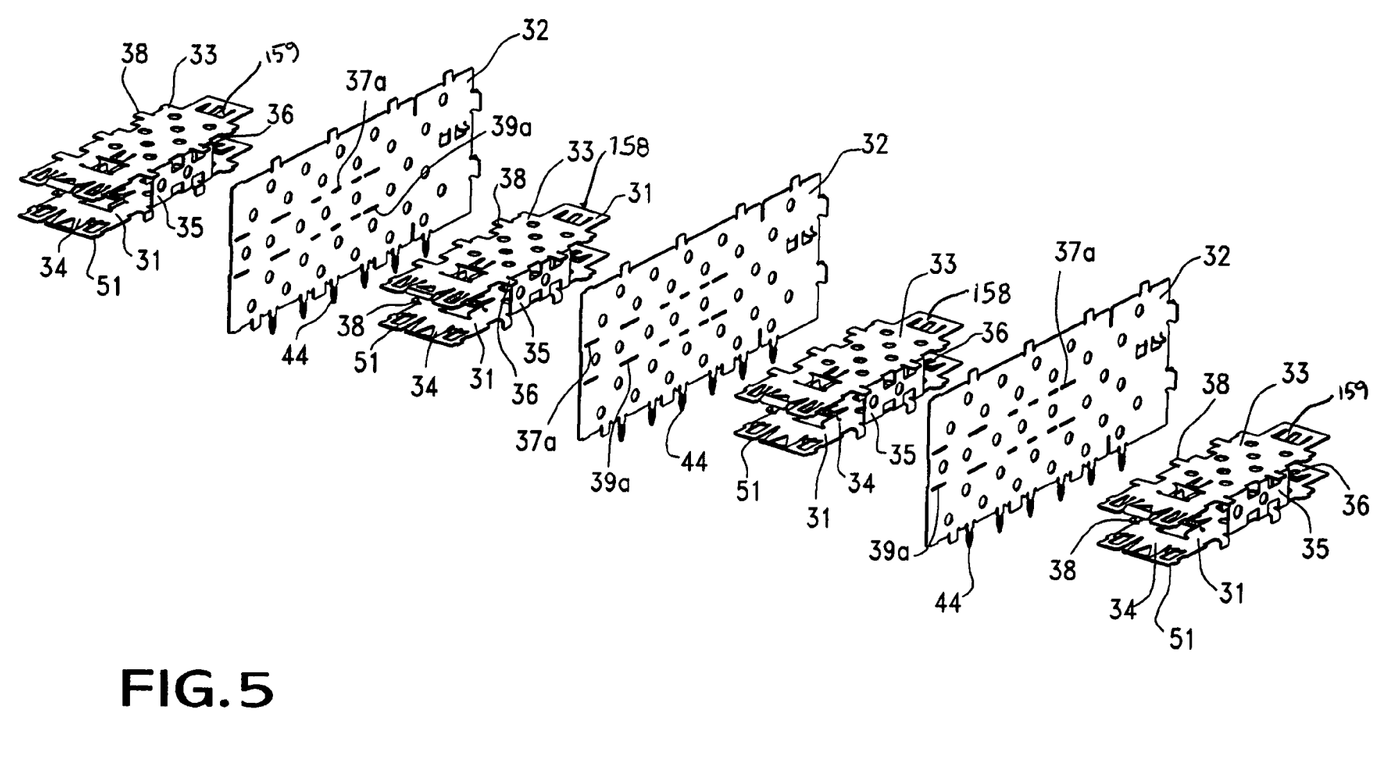
FIG. 5 is a fully exploded perspective view of FIG. 4.

FIG. 4 shows off set edges 42 of the horizontal components 31. Complementary off set surfaces 43, 42 are provided in each of the horizontal walls 31 & 34 as illustrated in the detail view of FIG. 4A. This arrangement provides an interlocking arrangement in order to enhance the rigidity and integrity of the cage assembly. In this manner a tab of one of the horizontal wall members extends into an offset recess 43 of the adjacent horizontal wall member through the openings 37*a*, 39*a* in the interior wall members 32, while a tab on the adjacent horizontal wall member extends through the opening into the corresponding opposing recess 42. The alignment of the interior (vertical) wall member 32 with respect to the tabs and recesses is shown in enlarged detail, with the position of the vertical intermediate wall member being shown in phantom in FIG. 4A.

The interior vertical wall members 32 also may include one or more circuit board mounting pins 44*a* provided for registry with slots 45*a* in the bottom wall 45 of the cage assembly and provide a direct connection to ground circuits on the circuit board. (FIG. 3). The bottom wall 45 may also be provided with off set edges in the form of tabs 46 for interlocking registry with offset recesses 47 in the vertical walls of the cover component 25. (FIG. 3.) The circuit board mounting pins 44*b* are provided on the cover component 25 for mating registry with bottom wall slots 45*b*. The circuit board pins 44*a*, 44*b* find registry in suitable openings (not shown) within circuit board 23. These conductive pins 44, 44*a*, 44*b* all-serve to define points of connection to ground circuits on the circuit board in rows along the perimeter of the module receiving bays defined along the bottom row of bays of the cage assembly, thereby providing a short path to ground throughout the entire cage assembly 21.

Figures 9, 9A:
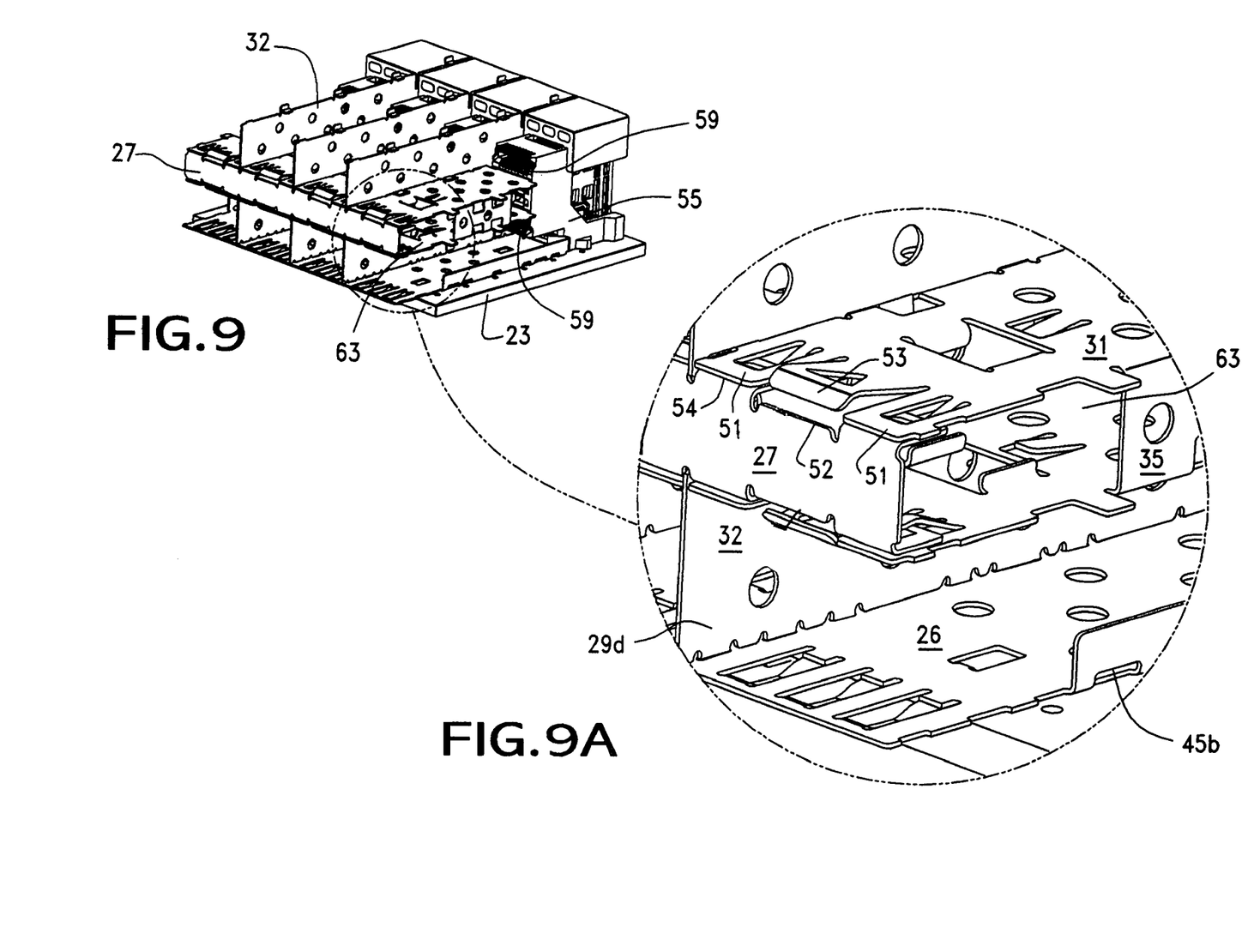
FIG. 9 is a perspective view of the interior portion of the shielding cage assembly engaged to an array of connectors.
FIG. 9A is an enlarged detail view of the interengagement between the spacer structure, the vertical walls and the front cover plate for the spacer; and, FIG. 10 is a cross-sectional view along the line 10-10 of FIG. 1 with the face plate removed, illustrating one of the bays of the shielding cage assembly with a connector in places therewithin

Each interior wall 32 of the cage assembly 21 includes one or more upstanding cover engagement tabs 48 which register with and fit into cover upper wall slots 49 disposed on the cover component 25. These likewise can be peened over, after the cage assembly construction is complete. Such peening over is illustrated at tabs 48 & 36 in FIGS. 1 & 2. In the illustrated embodiment, each panel or leg 33, 34 of the spacer components 31 preferably defines the bottom (or top) of a module-receiving bay when the spacer component is assembled into the cover, base and interior walls. It also preferably includes one or more end tabs 51 that flank the front edges of these bays or channels. These end tabs further define a cantilevered latch member 53 that is bent into the module-receiving bay (either upwardly or downwardly depending on the row of the assembly in which the channel is positioned. These latch members 53 may be further preferably aligned with openings 52 that are formed in the endcap 27 of the spacer component 31. These openings permit the latch members 53 to deflect under pressure of the modules inserted into the bays. The end tabs 51 include U-shaped slots with tabs or fingers 54 that are bent so as to make secure electrical contact with opposing surfaces of the end cap 27. This structure is shown best in the detailed view of FIG. 9A.

Figure 6:
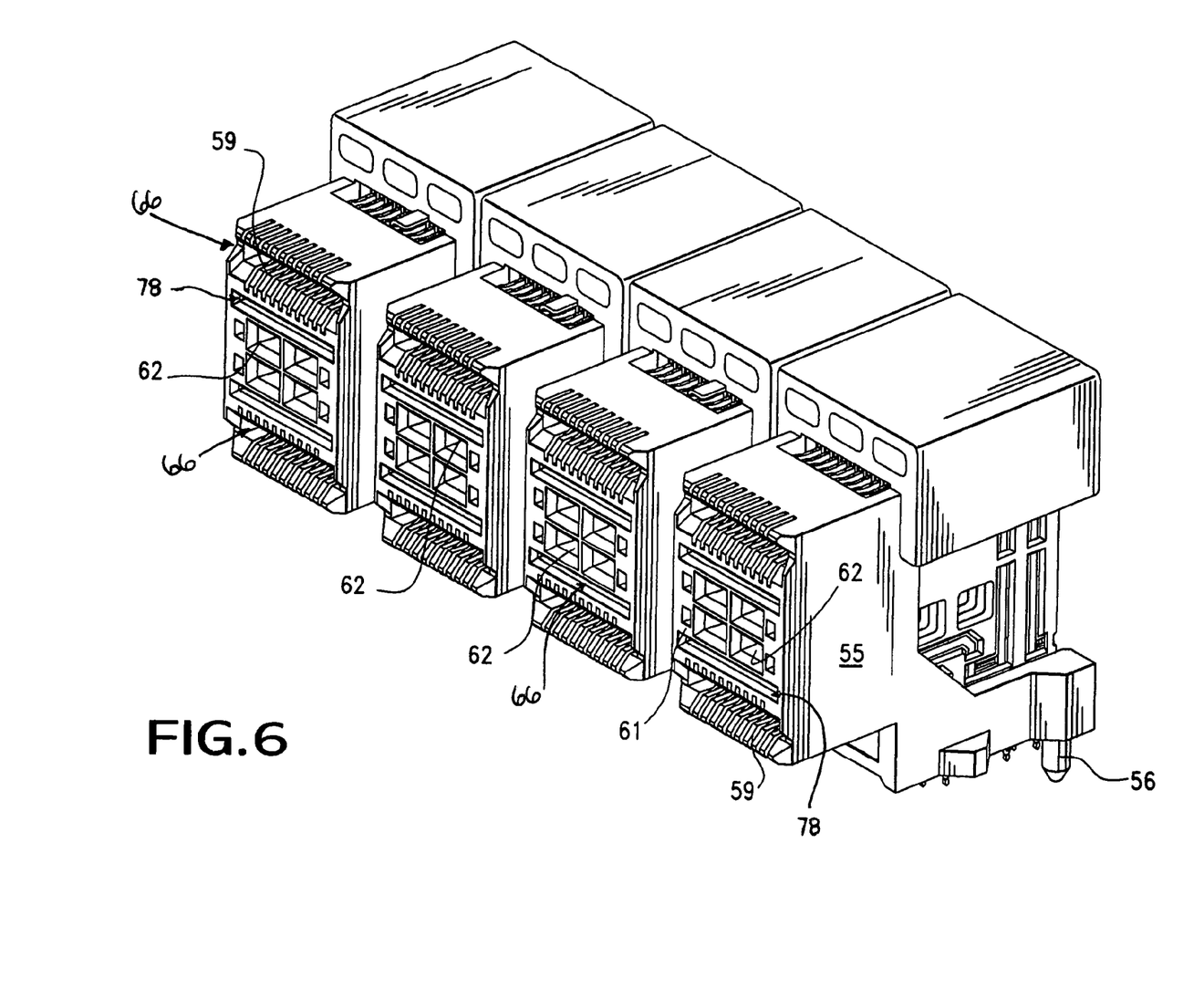
FIG. 6 is a perspective view of an array of connectors suitable use in the cage assembly of FIG. 1.

FIG. 6 shows an array of connectors 55 of the type which are preferably accommodated by the cage assembly 21 that is illustrated in the drawings. Circuit board pins 56 facilitate the connection of the connector to a circuit board or the like. As is evident from FIG. 7, connector 55 includes a housing 57 and a plurality of wafers of conductive terminals 58 disposed therein in a desired pattern. Conductive terminals 59 are positioned at the front face 61 of each connector 55, within card-receiving slots 66 that are formed in the connector housings 57 and which receive the mating edge of circuit boards (not shown) therein. As is evident from FIG. 9, the connectors 55 are received within the cage assembly 21 and are typically inserted into the cage assembly 21 from the open rear thereof, shown in FIG. 9 absent the cover component 25. It will be appreciated that the terminals 59 are thereby positioned to be at the interior end of each of the bays 28 and 29. With this arrangement, suitable electronic modules (not shown) may be inserted into each bay as desired such that the conductive terminals 59 engage suitable conductive components of the respective electronic modules.

In a preferred arrangement according to the invention, light pipes (not shown) or the like may be engaged with one or more of the ports 62 formed in the housings 57 of the connectors 55, and at one end thereof communicate with the circuit board 23, while at the other end thereof the light pipes fit within respective passageways 63 positioned between the spaced-apart legs 33 and 34 of the spacer component 31. Typical light pipes are generally L-shaped components that are positioned in opposition to illuminators located on the circuit board, while the opposite ends of the light pipes are preferably held in place and in selected alignment by a conductive end cap 27, which end cap typically would be formed of a conductive material. By this approach, the end cap 27 may provide a means of electrically connecting the bays of the shielding assembly together, as well as providing a measure of electromagnetic interference shielding across the intervening space in which it resides. The end caps typically would include indicia and/or suitable openings associated with light pipes as generally known in the art.

End caps 27 typically also serve to keep the light pipes together in a selected alignment along their lengthwise extent through the intervening space or passageway 63 (FIG. 10) between the module-receiving bays 28 on one level and the bays 29 on another level of the cage shielding assembly 21. Any such recesses may be located elsewhere in the connector in order to allow access through or around the connectors between the entered inning spaces 63 and the circuit board 23. Once the connectors 55 are positioned within the cage assembly 21, the conductive rear wall 24 seals off the back of the cage. With this approach, the cage assembly 21 provides complete conductive shielding of the modules that mate with the connectors 55 that are held within the cage assembly 21.

With more particular reference to the connectors 55, this particular style is suitable for use in small form factor applications. The connector housing 57 is formed from an insulative material and may be formed by a suitable process such as injection molding. The housing 57 has a body 64 with a forward engagement portion 65 with a frontal face upon which the card-receiving slots 66 are disposed. The housing further includes, as illustrated, a base portion 67 and a top portion 68. The base and top portions 67, 68 extend rearwardly from the forward engagement portion 65 and cooperatively define what may be considered as an internal cavity 69 of the connector that opens to the rear of the connector. The base may include mounting members, shown as posts 56, and may further include stabilizing lugs 71 that extend out from the side of the connector housing 57 in lateral directions so that the bottom surfaces thereof abut the circuit board on which the connectors 55 are mounted.

The plurality of terminals or wafers 58 are housed within this cavity 69. Spacing of the conductive terminals 59 from each other permits the terminal assemblies to be used in the connectors 55 for the stacked configuration illustrated. Terminals 59 are initially supported in a lead frame, and they preferably are inserted into a mold where terminals are separated and a supporting dielectric frame of the terminals 58 is preferably molded over portions of the terminals in a known manner. The dielectric frame provides a measure of thickness to the terminal assembly and further defines a body portion of the assembly.

The connectors 55 have terminals which include body portions 81 that interconnect the contact portions 72 with the tail portions 73 together, and the overall configuration of the terminals of the assembly is L-shaped. The illustrated connector assembly has a generally square or rectangular configuration, with four distinct sides. Terminals 59 include contact portions 72 that extend along one side of the assembly and tail portions, shown as compliant pin portions 73 that extend along and out from another side of the assembly. These two sides are adjacent each other as shown in the drawings, although other configurations may be suitable.

Figure 7:
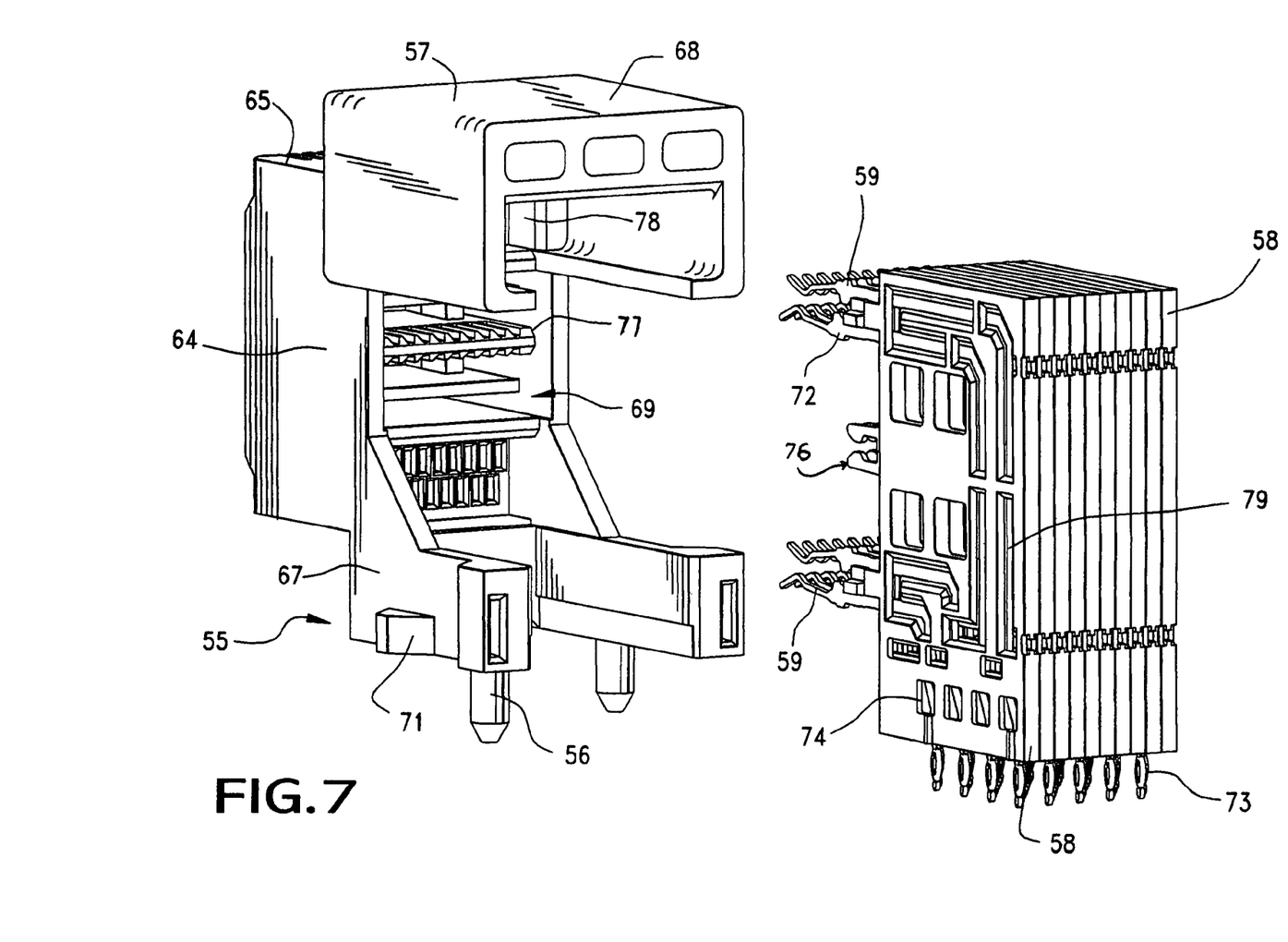
FIG. 7 is an exploded perspective view of one of the connectors of FIG. 6, taken from the rear.
Figure 8:
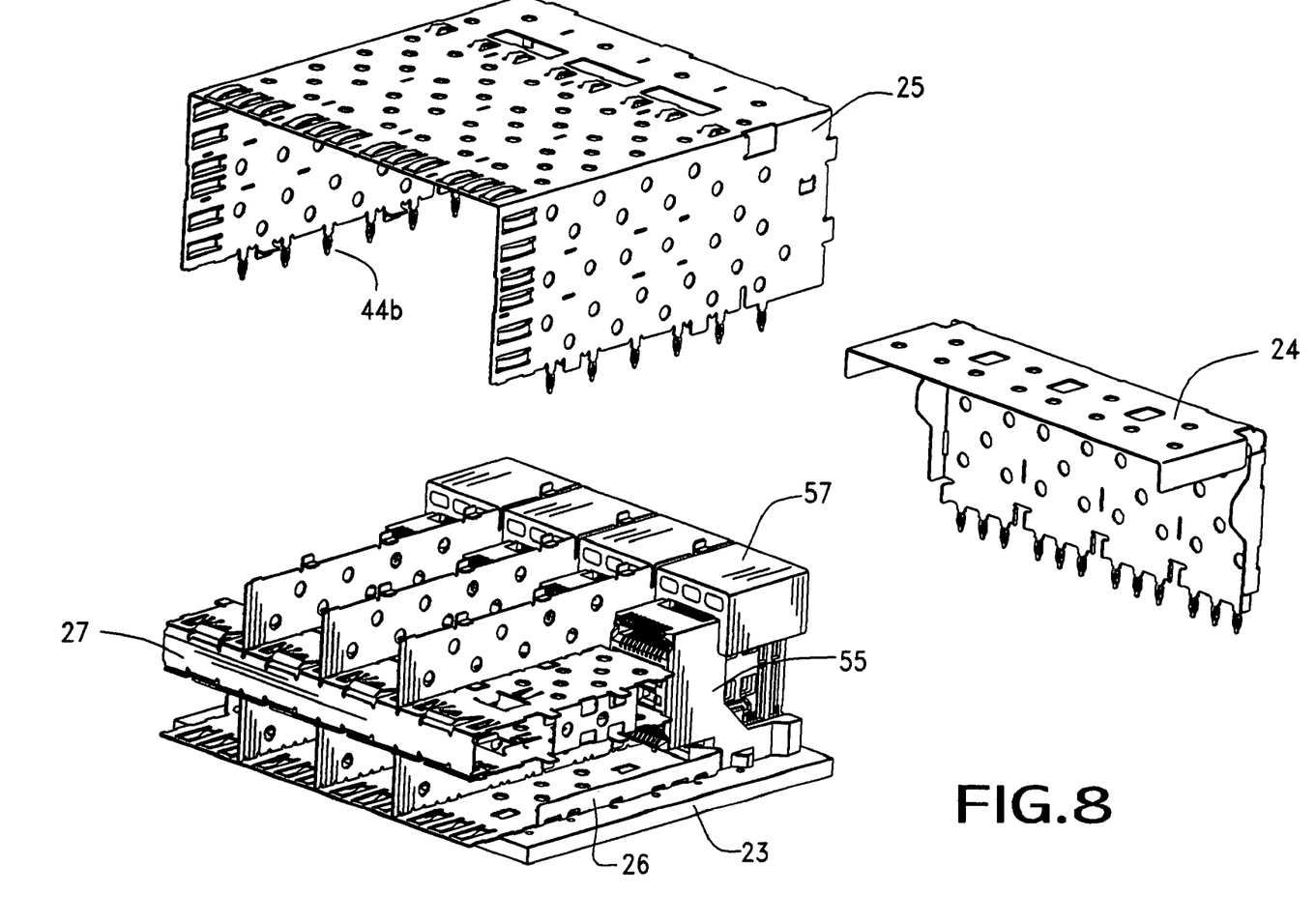
FIG. 8 is an exploded perspective view of the cage assembly of FIG. 1, with the face plate removed for clarity and showing connectors positioned on the circuit board and within portions of the cage assembly.
Figure 10:
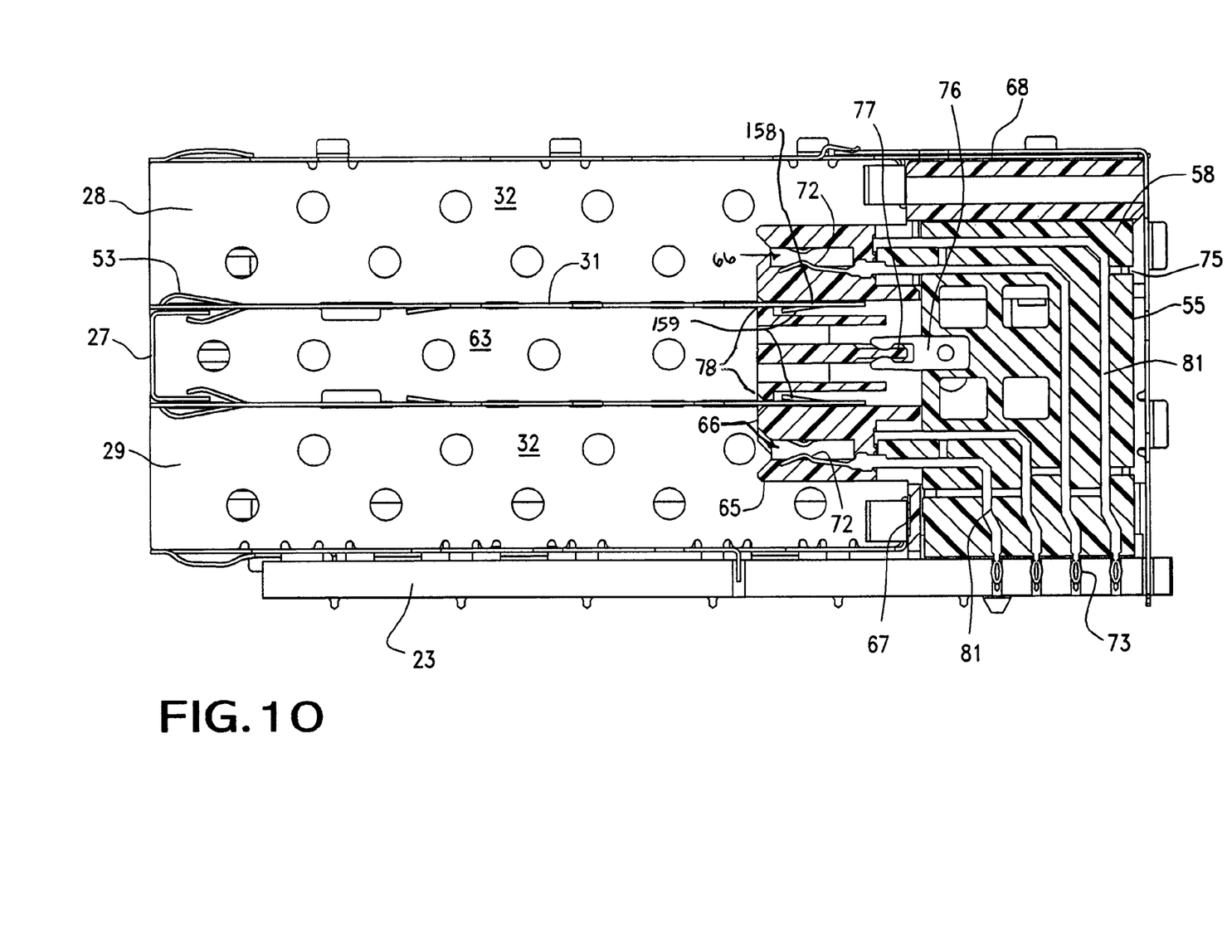

FIG. 10 provides further details, particularly with respect to the connectors 55. As can be seen in FIG. 7, the frame may include openings 74 that follow the path of the terminals, with one opening tracking one terminal. These openings 74 expose portions of the terminals to air and are suitable for providing an air-terminal interface between selective portions of terminals of the connector. This may be used for affecting the impedance of the system in which the connector is used, and particularly the impedance of the terminals of the terminal assembly. The rear edge of the terminal assemblies may include notches 75 (FIG. 10) or other suitable openings which may receive a transverse alignment bar (not shown) for maintaining the rear of the assemblies together in alignment as a group.

Each terminal assembly 58 preferably is provided with means for engaging the connector housing 55, and this engagement means as illustrated as an elongated clip member 76 that is disposed along one side, the front side of the terminal assembly. This clip member 76 is disposed between two sets of terminal contact portions 72 and extends forwardly of the terminal assembly frame 58 in order to contact an opposing ledge 77, shown as a shoulder or bar, or similar engagement member in the connector housing. The terminal contact portions 72 are likewise received within slots formed in the connector housing and typically disposed on the opposite side of card receiving slots 66.

Importantly, each of the connectors is formed in a stacked configuration, with two card-receiving slots 66 formed in its housing 57 and spaced vertically apart from each other on the face of the connector. In between these card-receiving slots 66, there are preferably located a pair of slots 78 that extend horizontally on the face of the connector housing 57. These slots 78 receive rearward extending engagement members, such as tabs 158, as shown in FIG. 10 to position the spacer members 31 properly with respect to the connectors 55. The tabs 158 may be provided with retention bars or tang portions 159 that are formed as part of the tabs 158 and which are bent slightly so as to prevent the tabs 158 from being easily pulled out from their corresponding connector slots 78 in the connector housings 57.

It will be appreciated that the cage assembly structure for connectors which is of a type discussed herein avoids the need for separate individual panels such as separate top and side panels, but a single cover element is provided. Likewise, individual transceiver cages are not required. Instead, a 2×4 style for multiple transceiver modules is formed, it being appreciated that other arrays are possible, depending upon the device. The spacers provided according to the invention are integral to the cage construction and do not require separate unique spacers for different configurations. The cage assembly also has an open rear area which permits mounting of edge card connectors directly to the cage. It will be appreciated that the interior walls 32 extend completely from the top wall to the bottom wall and that the spacer elements 31 are inserted between these interior walls, thereby providing intervening space between the top array of bays and the bottom array of bays. Any number of spacer elements 31 may be used to form cage assemblies that have two rows of any number of module-receiving bays It will be understood that the embodiments of the present invention which have been described are illustrative of some of the applications of the principles of the present invention. Numerous modifications may be made by those skilled in the art without departing from the true spirit and scope of the invention, including those combinations of features that are individually disclosed or claimed herein.

I claim:

1. A shielding cage assembly for providing a shielding cage around a connector, comprising:

a conductive base member;

a conductive cover member engageable with the base member to form a hollow interior space;

a rear wall member engageable with at least the cover member for closing off a rear end of the shielding cage assembly;

at least one conductive vertical wall member disposed in the hollow interior space and contacting said base, cover and rear wall members, the vertical wall member subdividing said hollow interior space into two hollow interior subspaces, a U-shaped conductive spacer member that interlocks with said vertical wall member and which contacts said cover member at two distinct locations, the spacer member further subdividing said hollow interior space into four hollow interior subspaces, the spacer member including at least one engagement flange member extending in a plane of said spacer member and rearwardly away from said spacer member toward said rear wall member for fixedly engaging a connector inserted into said hollow interior space.

2. The shielding cage assembly of claim 1, wherein said vertical wall member includes at least one slot formed therein and said spacer member includes at least one engagement tab that extends into the vertical wall member slot to interlock said vertical wall member and said spacer member together.

3. The shielding cage assembly of claim 1, wherein said flange member extends rearwardly with respect to said cover and base members and includes a retention barb for engaging a connector housing.

4. The shielding cage assembly of claim 1, wherein said spacer member is U-shaped with two leg portions that extend in two spaced apart planes in said hollow interior space, the spacer member leg portions subdividing each of said two hollow interior spaces into three hollow interior subspaces, each of spacer member leg portions including an engagement flange extending rearwardly toward said rear wall member for fixedly engaging said connector at two spaced apart locations.

5. The shielding cage assembly of claim 4, wherein said cage assembly includes four spacer members and four vertical wall members, said spacer and intermediate wall portions being interlocked together to define two distinct horizontal rows of hollow bays, each of said rows including four distinct hollow bays, each of said bays being sized to receive an electronic module therein.

6. The shielding cage assembly of claim 1, wherein said spacer member is U-shaped with two leg portions that are spaced apart from each other by an interconnecting base portion so that said spacer member defines at least an additional hollow interior space between the two leg portions thereof.

7. The shielding cage assembly of claim 6, further including a coductive end cap that is engageable with said spacer member to close off said additional hollow interior space.

8. A shielding cage assembly, comprising:
a conductive base member;
a conductive cover member engageable with the base member to form a hollow interior space;
at least one conductive vertical wall member disposed in the hollow interior space and contacting said base and cover members, the vertical wall member subdividing said hollow interior space into two hollow interior subspaces, the two hollow interior subspaces being disposed on opposite sides of said vertical wall member and further disposed between said vertical wall member and said cover member;
at least one U-shaped conductive spacer member that interlocks with said vertical wall member and which contacts said cover member at two distinct locations, the spacer member further subdividing said hollow interior space into four hollow interior subspaces, the spacer member including two leg portions that extend in two spaced apart planes, the spacer member leg portions subdividing each of said two hollow subspaces into three hollow interior subspaces, said spacer member further including at least one flange member extending in a plane of said spacer member and away from said spacer member for engaging a connector module inserted into said hollow interior space.

9. The shielding cage assembly of claim 8, wherein said cage assembly includes four spacer members and four vertical wall members, said spacer and intermediate wall portions being interlocked together to define two distinct horizontal rows of hollow bays, each of said rows including four distinct hollow bays, each of said bays being sized to receive an electronic module therein.

10. The shielding cage assembly of claim 8, wherein said vertical wall member includes at least one slot formed therein and said spacer member includes at least one engagement tab that extends into the vertical wall member slot to interlock said vertical wall member and said spacer member together.

11. The shielding cage assembly of claim 8, wherein said spacer member two leg portions that are spaced apart from each other by an interconnecting base portion.

12. The shielding cage assembly of claim 8, further including a conductive end cap that is engageable with said spacer member to close off said additional hollow interior space.

13. The shielding cage assembly of claim 8, wherein said flange member extends rearwardly with respect to said cover and base members and includes a retention barb for engaging a connector housing.

* * * * *